United States Patent [19]

El-Ayat et al.

[11] Patent Number: 5,254,886
[45] Date of Patent: Oct. 19, 1993

[54] CLOCK DISTRIBUTION SCHEME FOR USER-PROGRAMMABLE LOGIC ARRAY ARCHITECTURE

[75] Inventors: Khaled A. El-Ayat, Cupertino; King W. Chan, Los Altos; William C. Plants, Santa Clara, all of Calif.

[73] Assignee: Actel Corporation, Sunnyvale, Calif.

[21] Appl. No.: 901,604

[22] Filed: Jun. 19, 1992

[51] Int. Cl.⁵ .......................................... H03K 19/177
[52] U.S. Cl. ..................... 307/465; 307/443; 307/465.1; 307/480; 307/243
[58] Field of Search ............... 307/465, 443, 480–481, 307/465.1, 243

[56] References Cited

U.S. PATENT DOCUMENTS

| | | | |
|---|---|---|---|
| 4,706,216 | 11/1987 | Carter | 307/465 X |
| 4,758,745 | 7/1988 | El Garmal et al. | 307/465 |
| 4,870,302 | 9/1989 | Freeman | 307/465 |
| 4,910,417 | 3/1990 | El Gamal et al. | 307/243 X |
| 5,003,200 | 3/1991 | Sakamoto | 307/465 |
| 5,023,484 | 6/1991 | Pathak et al. | 307/480 X |
| 5,122,685 | 6/1992 | Chan et al. | 307/465.1 |
| 5,144,166 | 9/1992 | Camarota et al. | 307/465.1 |
| 5,151,623 | 9/1992 | Agrawal | 307/480 X |

*Primary Examiner*—David R. Hudspeth
*Attorney, Agent, or Firm*—Kenneth D'Alessandro

[57] ABSTRACT

A clock distribution architecture is disclosed for use in a user-programmable logic array integrated circuit comprising an array of user-programmable logic elements having inputs and outputs, at least some of the user-programmable logic elements including sequential logic elements having clock inputs, and further including a plurality of general interconnect lines which may be connected to one another and to the inputs and outputs of the logic elements. The clock distribution architecture includes at least one clock input pin on the integrated circuit, a plurality of clock distribution lines disposed in the array, at least one buffer amplifier having an input connected to the clock input pin and an output connected to at least one of the clock distribution lines. At least one inverter has an input connected to at least one of the clock distribution lines, and an output. A multiplexer is associated with each of the sequential logic elements, each of the multiplexers has a first input connected to one of the clock distribution lines, a second input connected to the output of the inverter, and a third input connected to a clock signal line connectable to at least one of the general interconnect line through a user-programmable element, an output connected to the clock input of the sequential element with which it is associated, and control inputs selecting which of the first, second, and third inputs is connected to the output.

4 Claims, 4 Drawing Sheets

CLOCK DISTRIBUTION SCHEME FOR USER-PROGRAMMABLE LOGIC ARRAY ARCHITECTURE

BACKGROUND OF THE INVENTION

1. Field of the Invention

The present invention relates to field programmable logic and interconnect architectures. More specifically, the present invention relates to a clock distribution architecture for use in field programmable interconnect architectures.

2. The Prior Art

Antifuse-based user programmable logic and interconnect architectures such as those manufactured by Actel Corporation of Sunnyvale, Calif. and disclosed in U.S. Pat. Nos. 4,758,745, 4,870,302, 4,910,417, and 5,055,718 are very useful circuit building blocks since they allow the user to configure a circuit as needed for a particular application. Other user-configurable architectures, such as the XC-4000 Series of Field Programmable Gate Array (FPGA) products manufactured by Xilinx, Inc., and the 7000 Series FPGA products manufactured by Altera Corporation are useful for the same general applications. Configuration of these circuits is performed by the user in his own environment using one of a number of different types of programmable interconnect elements. Architectures such as those noted above allow the configuration of both combinational and sequential circuits as needed. The function of the circuit elements and the required interconnected pattern to configure the circuit to the desired circuit application are simply programmed into the circuit.

A common problem encountered with architectures which employ this approach is the delay introduced into the circuit paths between logic circuit modules by the interconnect elements themselves. This delay is due to the resistance and capacitances associated with the interconnect element and architecture and has heretofore been accepted as the price to be paid for user programmability.

Masked gate arrays have significantly lower interconnect delays than do their user-programmable counterparts because the resistive and capacitive component of the interconnect is significantly smaller. The delays in the circuit and the propagation delays of the logic function unit modules themselves determine the overall speed or performance of the masked gate array application circuit.

Since typical application circuits in such architectures include sequential elements, such as flip-flops and latches, programmably connectable clocking capability is required to interconnect clocks to the clock inputs of each latch and flip flop in the circuit to correctly operate the sequential circuits. Typical application circuits require only a few clocks in the entire circuit which are common and shared by all sequential elements. Application circuits employing a single clock network providing for complementary system clocks, such as the Xilinx XC-4000 series FPGA and the Altera series of EPLDs, are known in the art.

Due to the interconnect delay inherent in general routing and interconnect and the need to avoid timing violations, clock networks must be handled separately and in a different manner than interconnect for other circuit networks. In order to minimize the inherent delay in clock distribution networks, some architectures, like the one employed by the Xilinx XC-4000 Series products and the Altera series of EPLDs, have employed dedicated clock distribution networks which do not contain any user-programmable elements in the clock paths.

Despite the existence of the above-named products and similar products, there remains room for improvement in the organization, speed and versatility of clock network architectures for use in user-programmable integrated circuit products.

It is an object of this invention to provide a clock distribution scheme which allows significantly higher circuit operating speeds than are permitted in prior art architectures.

It is another object of this invention to provide a clock distribution scheme which consumes less power than schemes in prior art architectures.

It is a further object of this invention to provide a clock distribution scheme which provides smaller clock skew within a net than in prior art architectures.

It is a further object of the present invention to provide a clock distribution scheme which is more versatile than prior art clock distribution schemes.

BRIEF DESCRIPTION OF THE INVENTION

A clock distribution scheme for an integrated circuit user-programmable logic array architecture according to the present invention includes at least one clock input pin on the integrated circuit, a buffering means including at least one buffer amplifier, the output of the buffering means driving a plurality of clock distribution lines. An inverting buffering means is connected to the output of the buffering means and drives a plurality of complementary row clock distribution lines. A multiplexer is provided upstream from the clock input of each sequential logic element in the array for connecting either a clock distribution line, a complementary clock signal, or a signal line connectable to at least one general interconnect line through a user-programmable element. The signal line input of the multiplexer may be connectable to a second clock input pin on the integrated circuit as well as to general interconnect lines.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

A clocking scheme according to the present invention has superior performance characteristics and lower power consumption compared with other techniques. According to the present invention, a dedicated programmable clock network is distributed throughout the logic array and can be programmably connected to the clock input of any logic element in the array.

Figure 1:
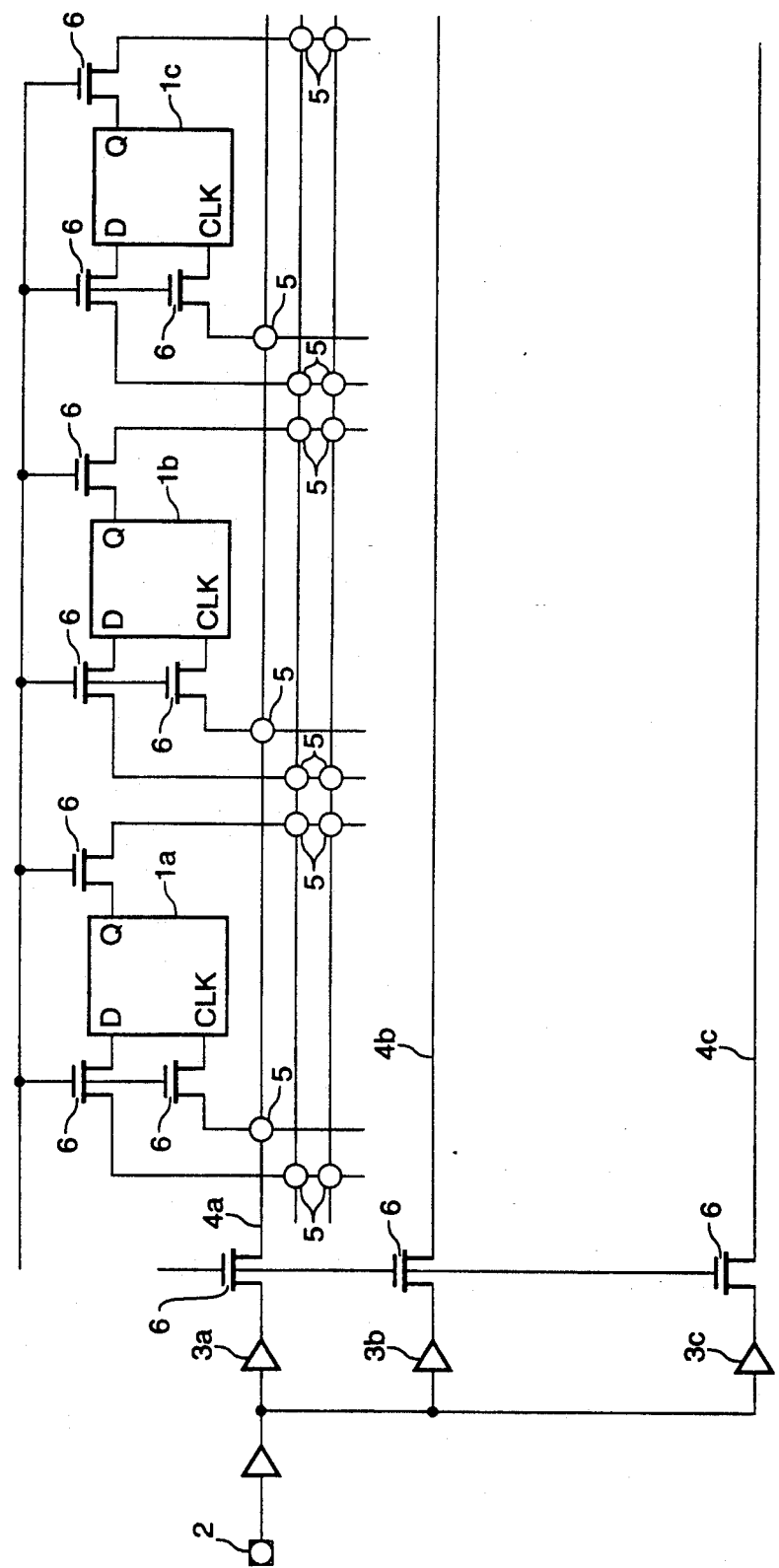
FIG. 1 is a schematic diagram illustrating one prior art programmable clock network that can be used with programmable interconnect architectures.

Referring first to FIG. 1, a typical prior art clock distribution network is shown in schematic diagram form. The prior art clock distribution network in FIG. 1 may be used in an array including a plurality of logic function units arranged in rows and columns. For simplicity, a single row is shown populated with logic function units 1a-1c in FIG. 1, but those of ordinary skill in the art will recognize that the second and third row positions are likewise populated.

An off-chip clock signal is first fed into the integrated circuit from an input pad 2. The clock signal is then buffered and distributed to every row or column in the architecture using separate clock drive buffers 3a-3c and clock rails 4a-4c for each row or column of the array. The row (or column)-buffered clock signal may then be selectively programmably connected to one or more logic function units in the row or column which require the clock signal by simply programming an appropriate programmable element, such as an antifuse or transistor. Exemplary elements are shown as circles 5.

In the case where high voltages are needed to program the programmable elements, which is common in present antifuse interconnect element and EPROM and EEPROM technologies, the programming path which is subjected to high voltage programming pulses must be isolated from any of the remainder of the circuits, such as drivers and logic circuit modules, which cannot withstand these voltages. Drivers and circuit modules are typically designed with low voltage transistors which operate in the 3-5 volt range because such devices have better performance characteristics than high voltage transistors. Thus, the low voltage circuits must be isolated from the high voltage circuits to avoid breakdown of the low voltae circuits while still attaining the high performance benefits of low voltage transistors. Such isolation may be provided by the isolation transistors 6 in FIG. 1.

Figure 2:
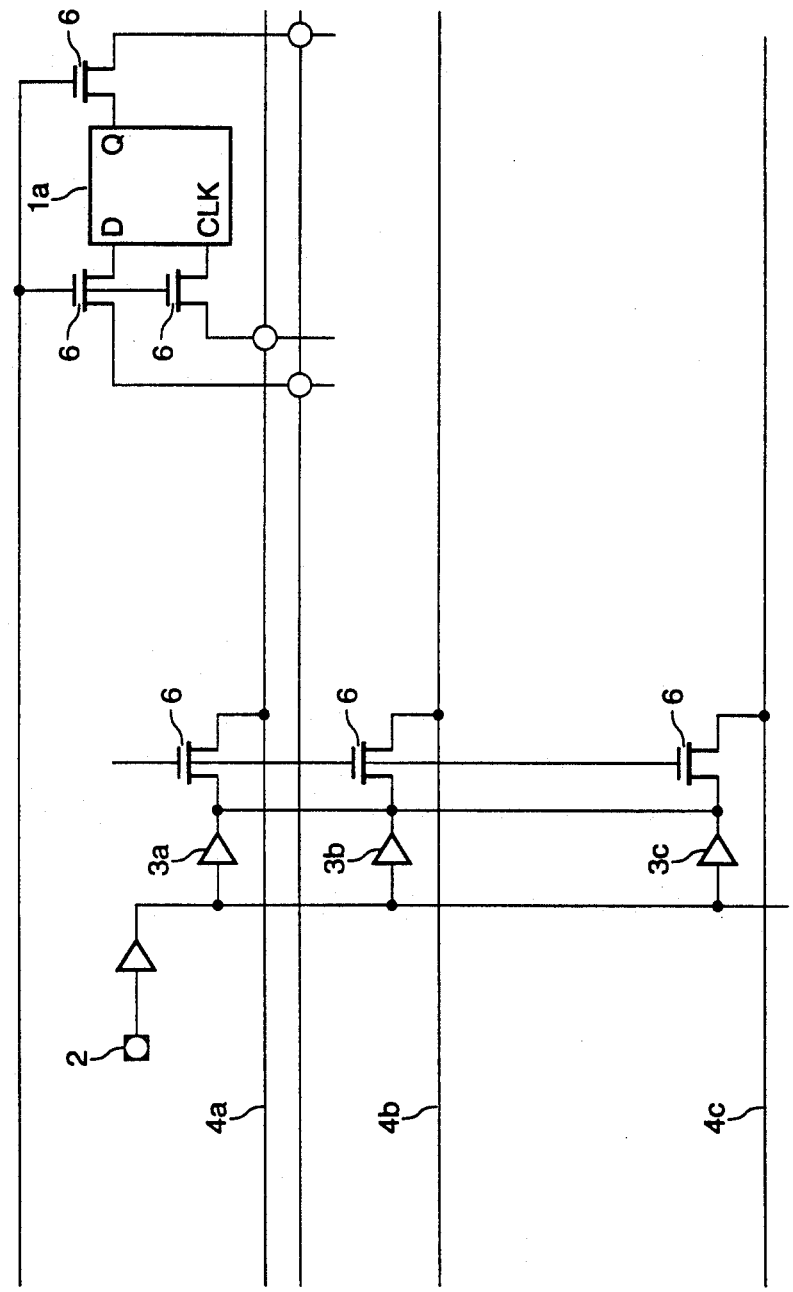
FIG. 2 is a schematic diagram illustrating another prior art programmable clock network with lower clock skew that can be used with programmable interconnect architectures.

Referring now to FIG. 2, another prior art clock distribution network is shown in schematic diagram form. For simplicity, only one logic function unit 1a is shown. Like the clock distribution network depicted in FIG. 1, the off-chip clock signal is first fed into the integrated circuit from an input pad 2. the clock signal is then buffered and distributed to every row or column in the architecture using separate clock drive buffers 3a-3c for each row (or column) of the array. As in the clock distribution network of FIG. 1, the low voltage circuits of the clock driver circuits of FIG. 2 must be isolated by isolation transitors 6 from the high voltage programming circuits to avoid breakdown of the low voltage circuits by the isolation transistors between the row or column driver buffer outputs and the clock lines.

The clock distribution network of FIG. 2 is different from the network of FIG. 1 in two ways. First, the outputs of all buffers 3a-3c are shorted together at their outputs. This scheme allows a more even distribution of the clock loads among the clock drivers since different rows of columns are likely to have different loads. Tying the outputs of the buffers together helps minimize the clock skew between lightly-loaded row or column and a heavily-loaded row or column. the second difference between the clock distribution network of FIG. 2 and that of FIG. 1 is that the buffers 3a-3c are laid out to drive each row or column from a central point instead of one end of the row or column as in conventional schemes.

Figure 3:
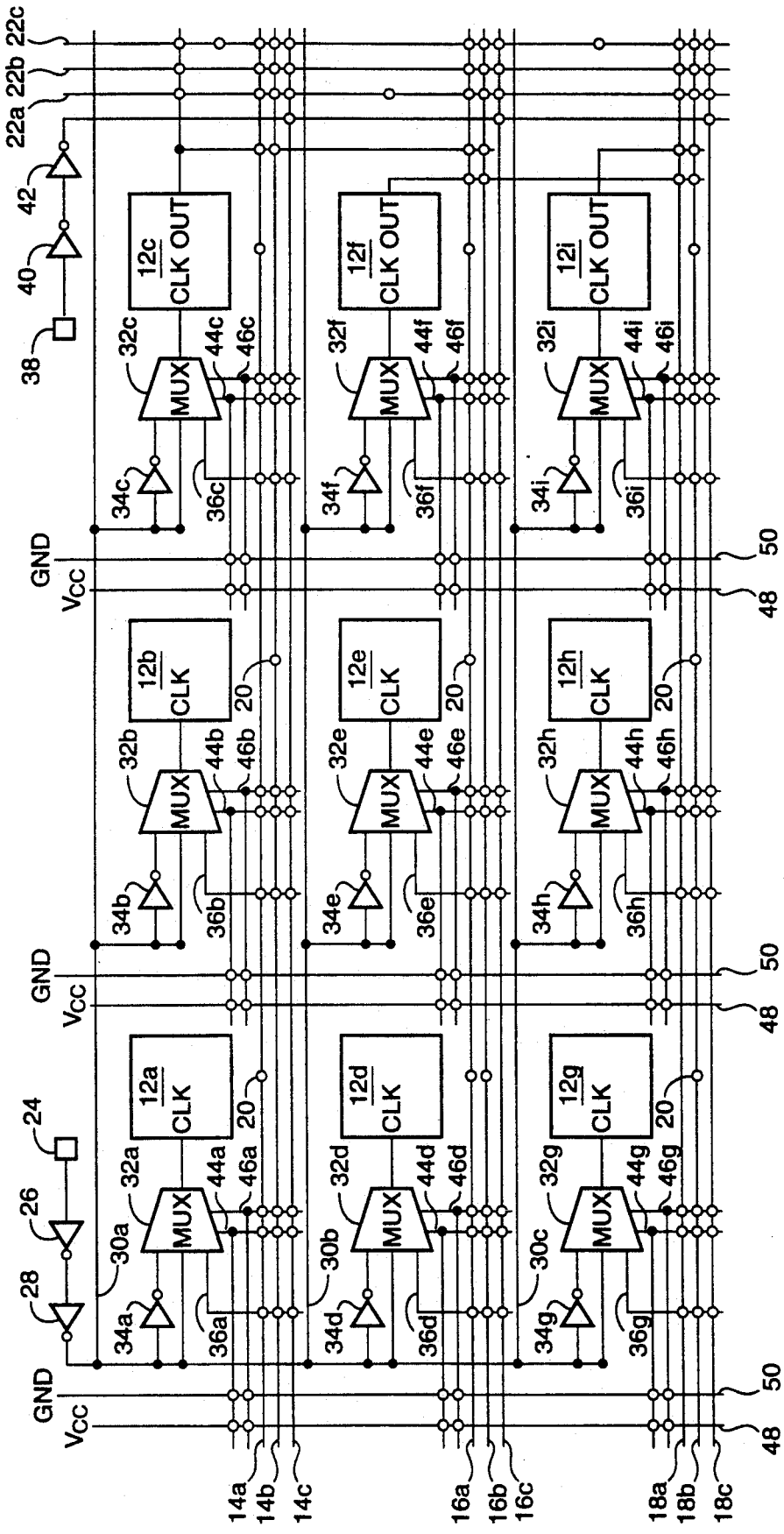
FIG. 3 is a schematic diagram illustrating a clock distribution network according to a presently-preferred embodiment of the invention.

Referring now to FIG. 3, an illustrative clock distribution network according to a preferred embodiment of the present invention is shown in schematic diagram form superimposed on an array of user-programmable logic elements disposed in a user-configurable interconnect architecture. The array of FIG. 3 comprises a 3×3 array and is, in that respect, illustrative only, since those of ordinary skill in the art will readily recognize that the present invention is applicable to arrays of arbitrary size.

The illustrative environment of the present invention in FIG. 1 includes an array of logic function modules, which are preferably user-programmable to define their individual functions. Some or all of the logic function modules may include sequential elements, such as flip-flops, latches, etc., which have clock inputs requiring clock signals. The array 10 of FIG. 1 is shown including three rows. A first row includes logic function unit modules 12a, 12b, and 12c. Second and third rows of array 10 include logic function modules 12d, 12e, and 12f, and 12g, 12h, and 12i, respectively.

Array 10 also includes a general interconnect architecture comprising a plurality of conductors which may be joined together by user-programmable elements, such as antifuses, RAM cells driving pass-gates, pass-transistors or other switching transistors, or the like. The general interconnect architecture is illustrated in FIG. 3 by the sets of horizontal conductors 14a-14c, disposed under the logic function unit modules in the first row, horizontal conductors 16a-16c, disposed under the logic function unit modules in the second row, and horizontal conductors 18a-18c, disposed under the logic function unit modules in the third, row. Various ones of these conductors, i.e., 14c and 16c, run the entire length of the array, and the others are divided into smaller length segments which may be connected together by programmable elements 20, which appear as small circles along the conductors. Programmable elements 20 may be any one of a number of known user-programmable interconnect devices. To avoid overcomplicating the drawing, not all programmable elements 20 are labeled with reference numerals.

A typical general interconnect architecture will also include sets of vertical conductors. These sets of vertical conductors are represented by an illustrative set of vertical conductors 22a-22c, located to the right of the last column of the array 10 comprising logic function unit modules 12c, 12f, and 12i. In an actual array, there will be a plurality of sets of vertical conductors distributed throughout the array, including between and perhaps above each column of logic function unit modules, but they are not shown here to avoid overcomplicating the drawing figure. Like the sets of horizontal conductors, certain of the vertical conductors 22a-22c are divided into smaller lengths and may be joined together using user-programmable interconnect elements 20. In addition, selected intersections of horizontal and vertical conductors are populated with user-programmable interconnect elements.

As in the clock distribution networks depicted in FIGS. 1 and 2, the clock signal of the present invention is distributed to every row and to every sequential element. A key difference between the prior art clock distribution schemes of FIGS. 1 and 2 and the clock distribution scheme of the present invention as shown in FIG. 3, is that the signal path through which the clock signal itself is propagated contains no programmable elements such as antifuses. No high voltage circuits are associated with this path.

A universal clock signal may be furnished to the integrated circuit of which array 10 is a part via an input/output pad 24. The clock signal is then suitably buffered, as shown by buffers 26 and 28. Those of ordinary skill in the art will recognize that inverting buffers 26 and 26 are merely one way of providing clock buffering and that other schemes will readily suggest themselves.

The output of clock input buffers 26 and 28 is furnished to row clock lines 30a, 30b, and 30c. Those of ordinary skill in the art will recognize that column clock lines could be used as well, and that other distribution regimes are possible. The purpose of the clock distribution lines is to provide a potential source of clock signals for each logic element in the logic function unit module array 10. While the embodiment illustrated in FIG. 3 shows row clock lines, those of ordinary skill in the art will recognize that column clock lines could be used as well and that the selection of a particular arrangement should be made such that the optimum distribution characteristics, i.e., resistance, and capacitance, are attained.

In order to provide the most versatility in the clock distribution scheme according to the present invention, the clock signals are provided to the individual logic function unit modules through multiplexers 32a–32i. As shown in FIG. 3, each multiplexer 32a–32i has three inputs. A first input is connected to the one of row clock lines 30a–30c associated with its row. A second input of each of multiplexers 32a–32i is connected to its row clock line through an inverter 34a–34i. Those of ordinary skill in the art will recognize that in an actual embodiment of the invention an individual inverter need not be supplied for each multiplexer but that one inverter may serve more than one multiplexer.

Further versatility is provided to the clock distribution scheme of the present invention by sourcing clock signals from virtually anywhere in the array by providing a path to the general interconnect structure of the array. The prior art has not appreciated provision of the combination of this feature with the other features of the invention. Thus, a third input to multiplexers 32a–32i are conductors 36a–36i. Each of these conductors forms intersections with a plurality of general interconnect conductors. The intersections are populated with user-programmable interconnect elements 20. For example, the conductors 36a–36c form intersections with segments of general interconnect conductors 14a–14c. In like fashion, the conductors 36d–36f form intersections with segments of general interconnect conductors 16a–16c, and the conductors 36g–36i form intersections with segments of general interconnect conductors 18a–18c.

Another feature of the clock distribution architecture of the present invention is the provision of the potential to route a second off-chip clock signal to each sequential element on the integrated circuit containing array 10. Accordingly, input/output pin 38 is connected through buffers 40 and 42 and user-programmable interconnect elements to general interconnect lines 14c, 16c, and 18c.

Multiplexers 32a–32i each are shown having two control lines 44a–44i and 46a–46i, which may be used to control which of their first, second, or third inputs is passed through to their outputs and thus to the clock inputs of their respective logic function unit modules. Each control line 44a–44i and 46a–46i is shown intersecting a $V_{cc}$ line 48 and a ground line 50 as well as the general interconnect lines 14a–14c, 16a–16c and 18a–18c for their respective rows. The intersections of the control lines with the $V_{cc}$, ground and general interconnect lines are populated with user-programmable interconnect elements, which may be programmed to individually select the clock source for each logic function unit module 12a–12i.

In the clock signal distribution network of FIG. 3, the clock signal path to any logic function unit module 12a–12i comprises the input/output pad 24, input buffers 26 and 28, distribution wires, a multiplexer 32a–32i, and the clock input node of the sequential element. The absence of user-programmable interconnect elements, such as antifuses, and the high-voltage devices required in the signal path because of the high voltages necessary to program them, allows the clock signal path to be optimized using low-voltage high-performance transistors instead of the mixture of high-voltage and low-voltage transistors used in prior art clock distribution schemes. Low-voltage transistors provide better performance compared with high-voltage transistors because they have thinner oxide isolation layers and shallower junctions with lower capacitance.

Figure 4:
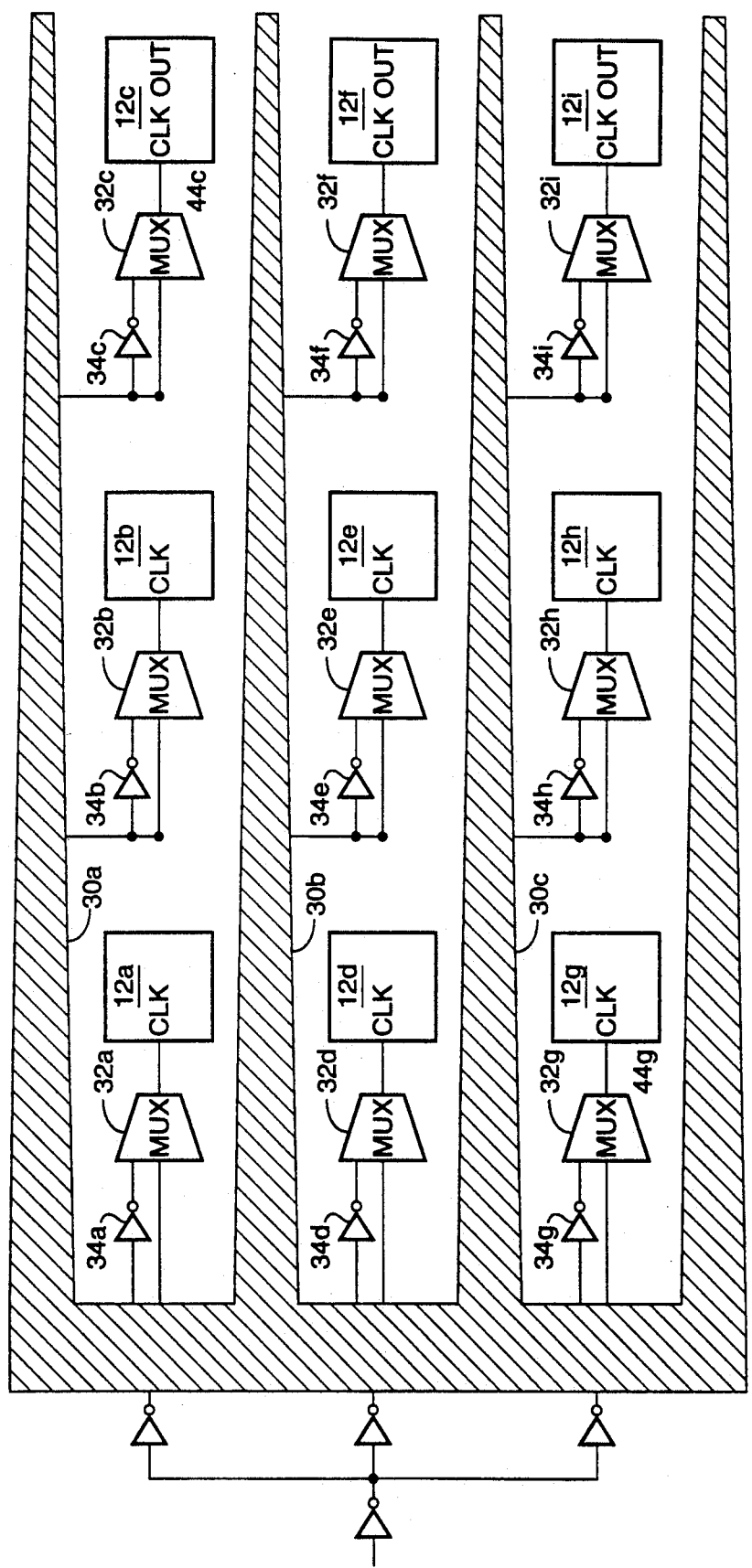
FIG. 4 is a block diagram of a logic module array combined with a top view of a metal interconnect layer to illustrate a preferred layout of clock lines according to the present invention.

According to another aspect of the present invention, the clock distribution lines are physically laid out in a manner which optimize their capacitance, resistance, and metal current electromigration requirements. Referring now to FIG. 4, a top view of a metal interconnect layer is superimposed on a block diagram of a logic module array showing only the logic modules, multiplexers, and inverters to illustrate a preferred layout of clock lines 30a, 30b, and 30c according to the present invention. As can be seen from FIG. 4, clock lines 30a, 30b, and 30c are formed from conductors in a metal layer which taper from a first width at the distribution bus end to a second narrower width at the distal end thereof. In an actual embodiment having 42 rows and 17 columns, the clock distribution conductors 30a, 30b, and 30c comprise a second layer metal and branch out from a metal bus line having a width of between about 16–20 microns. Each of clock distribution conductors 30a, 30b, and 30c have a starting width of about 10.4 microns and linearly taper to a width of about 4 microns at their distal ends. By tapering the clock distribution conductors 30a, 30b, and 30c, the resistance, capacitance, and metal current electromigration requirements of the clock lines may be optimized. The clock distribution conductors 30a, 30b, and 30c are shown driven by buffers 52a–52d.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. In an integrated circuit including a user-programmable logic array architecture comprising a plurality of user-programmable logic elements, each having data inputs and outputs, said user-programmable logic elements arranged in an array, at least some of said user-programmable logic elements including sequential logic elements having clock inputs, and further including a plurality of general interconnect lines which may be connected to one another and to said inputs and outputs of said logic elements, a clock distribution architecture including:

at least one clock input pin on said integrated circuit;
  a plurality of clock distribution lines disposed in said array;
  a buffering means, including at least one buffer amplifier having an input connected to said at least one clock input pin and an output connected to at least one of said clock distribution lines,
  at least one inverting means having an input connected to at least one of said clock distribution lines, said at least one inverting means having an output;
  a multiplexing means associated with each of said logic elements, each of said multiplexing means having a first input connected to one of said clock distribution lines, a second input connected to the output of said at least one inverting means, and a third input connected to a clock signal line connectable to at least one of said general interconnect line through a user-programmable element, an output connected to the clock input of the logic element with which it is associated, and means for selecting which of said first, second, and third inputs is connected to said output.

2. The clock distribution architecture of claim 1, wherein said clock signal line is connectable, directly or indirectly, to a second input/output pin of said integrated circuit through at least one of said general interconnect lines and at least one of said user-programmable elements.

3. The clock distribution architecture of claim 1 wherein each of said plurality of clock distribution lines comprises a conductive layer in said integrated circuit branching out from at least one common distribution bus, and further wherein each of said plurality of clock distribution lines tapers from a first width at its junction with said distribution bus to a second narrower width at a distal end thereof.

4. In an integrated circuit including a user-programmable logic array architecture comprising a plurality of user-programmable logic elements, each having data inputs and outputs, said user-programmable logic elements arranged in an array, and further including a plurality of general interconnect lines which may be connected to one another and to said inputs and outputs of said logic elements, a clock distribution architecture including:

at least one clock input pin on said integrated circuit;
  a plurality of clock distribution lines disposed in said array;
  a buffering means, including at least one buffer amplifier having an input connected to said at least one clock input pin and an output connected to at least one of said clock distribution lines;
  at least one inverting means having an input connected to at least one of said clock distribution lines, said at least one inverting means having an output;
  a multiplexing means associated with each of said logic elements, each of said multiplexing means having a first input connected to one of said clock distribution lines, a second input connected to the output of said at least one inverting means, and a third input connected to a clock signal line connectable to at least one of said general interconnect line through a user-programmable element, an output connected to an input of the logic element with which it is associated, and means for selecting which of said first, second, and third inputs is connected to said output.

* * * * *

UNITED STATES PATENT AND TRADEMARK OFFICE
CERTIFICATE OF CORRECTION

PATENT NO. : 5,254,886
DATED : October 19, 1993
INVENTOR(S) : Khaled A. El-Ayat, King W. Chan, William C. Plants It is certified that error appears in the above-indentified patent and that said Letters Patent is hereby corrected as shown below:

Column 1, line 31, replace "interconnected" with --interconnect--.
Column 3, line 40, replace "voltae" with --voltage--.
Column 3, line 49, replace "the" with --The--.
Column 3, line 67, replace "the" with --The--.

Signed and Sealed this

Twenty-eighth Day of May, 1996

Attest:

BRUCE LEHMAN

Attesting Officer     Commissioner of Patents and Trademarks